United States Patent [19]
Chan

[11] Patent Number: 5,998,226
[45] Date of Patent: Dec. 7, 1999

[54] METHOD AND SYSTEM FOR ALIGNMENT OF OPENINGS IN SEMICONDUCTOR FABRICATION

[75] Inventor: Victer Chan, San Jose, Calif.

[73] Assignee: LSI Logic Corporation, Milpitas, Calif.

[21] Appl. No.: 09/054,279

[22] Filed: Apr. 2, 1998

[51] Int. Cl.[6] .................................................. H01L 21/00
[52] U.S. Cl. .............................. 438/10; 438/401; 438/975
[58] Field of Search ................ 438/6, 7, 10, 11, 438/17, 18, 401, 975

[56] References Cited

U.S. PATENT DOCUMENTS

| | | | |
|---|---|---|---|
| 3,808,527 | 4/1974 | Thomas | 438/10 |
| 4,386,459 | 6/1983 | Boulin | 438/975 |
| 5,332,470 | 7/1994 | Crotti | 438/975 |
| 5,770,995 | 6/1998 | Kamiya | 438/975 |
| 5,904,563 | 5/1999 | Yu | 438/401 |

*Primary Examiner*—Chandra Chaudhari

[57] ABSTRACT

The system and method of the present invention enable the effective and efficient determination of the misalignment between openings located in the contact layer and the interconnect layer, respectively. In this way, defective semiconductors produced in semiconductor wafer fabrication can be readily identified and segregated for shipment to customers. A single multifunctional structure formed in the contact layer can be used to determine the alignment accuracy of the contact layer and the interconnect layer by (a) inline visual inspection and (b) determination of the end of line electrical resistance properties of the semiconductor wafer. Hence the use of the multi-functional aspects of this invention eliminates the correlation issues with the structure.

12 Claims, 3 Drawing Sheets

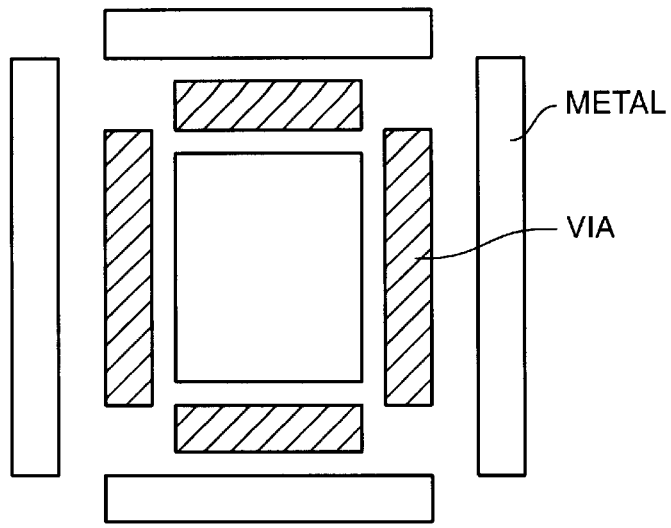
FIG._1A
(PRIOR ART)
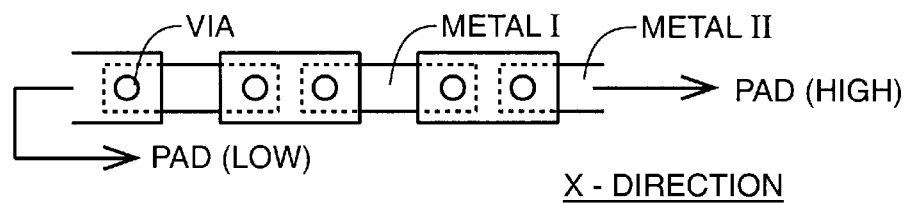
FIG._1B
(PRIOR ART)
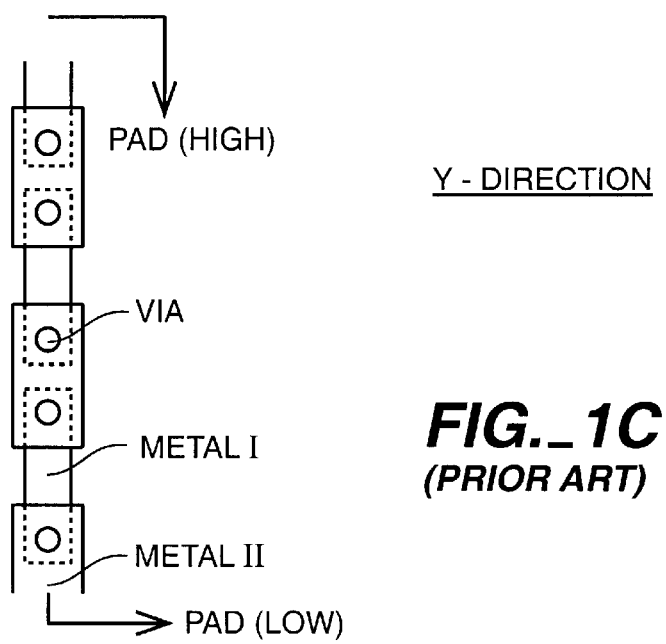
FIG._1C
(PRIOR ART)

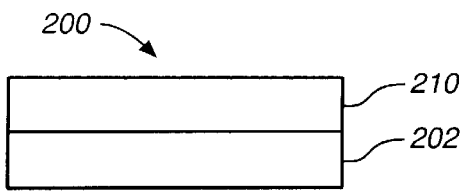
FIG._2A
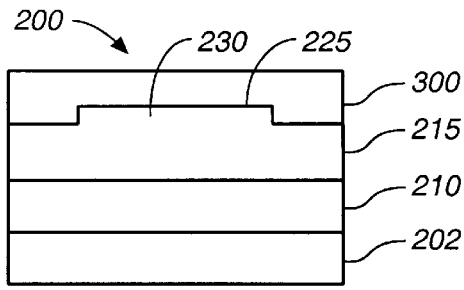
FIG._2F
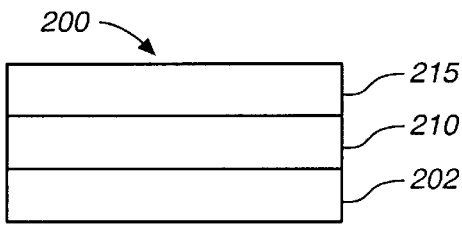
FIG._2B
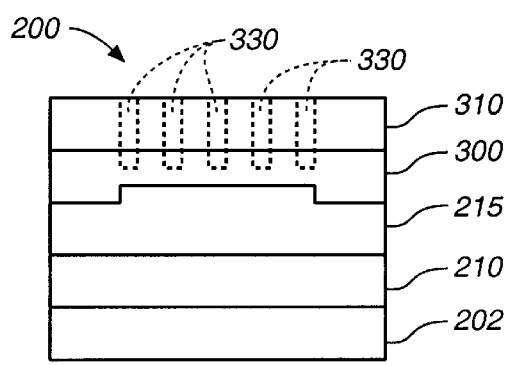
FIG._2G
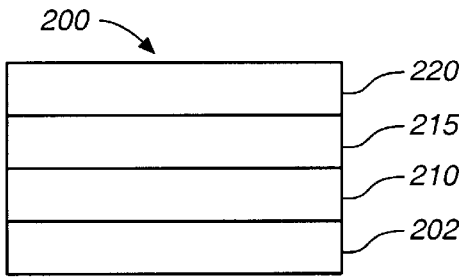
FIG._2C
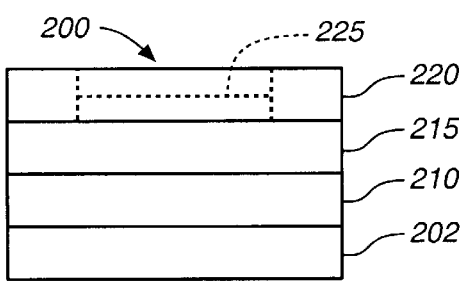
FIG._2D
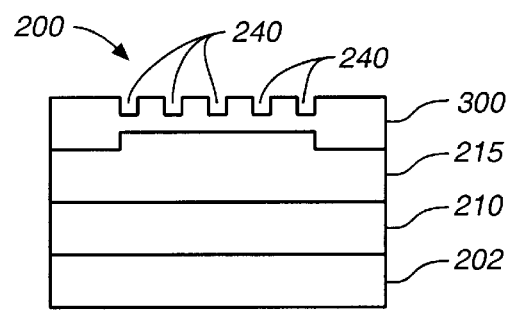
FIG._2H
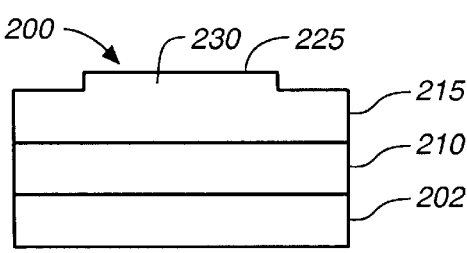
FIG._2E
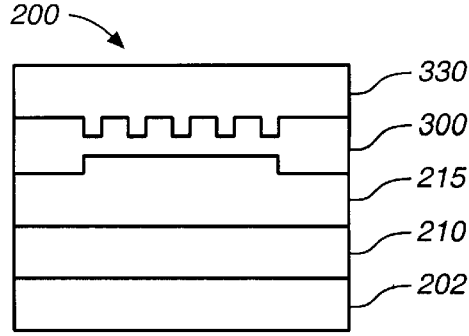
FIG._2I

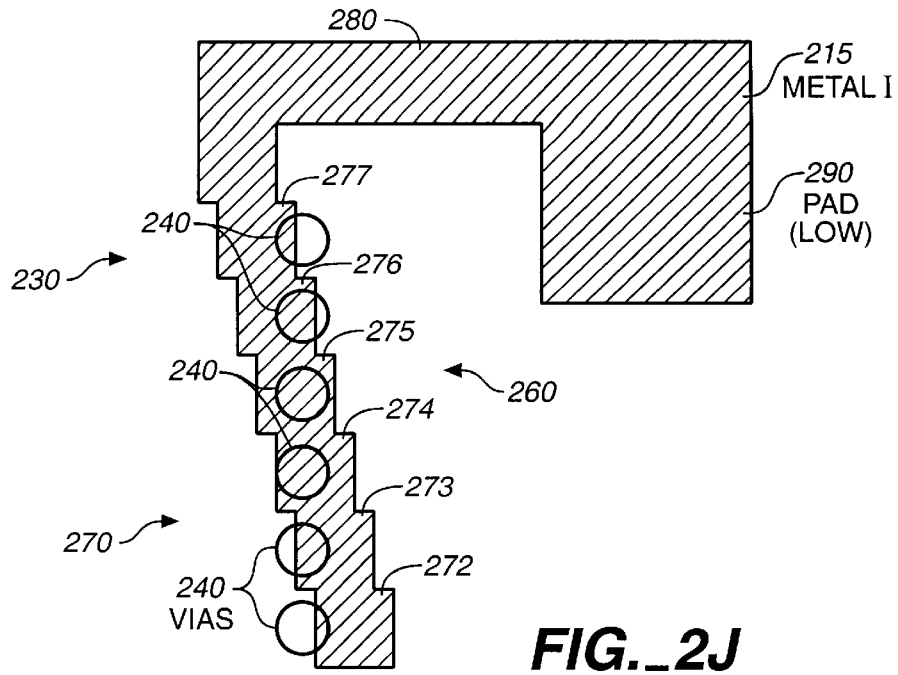
FIG._2J
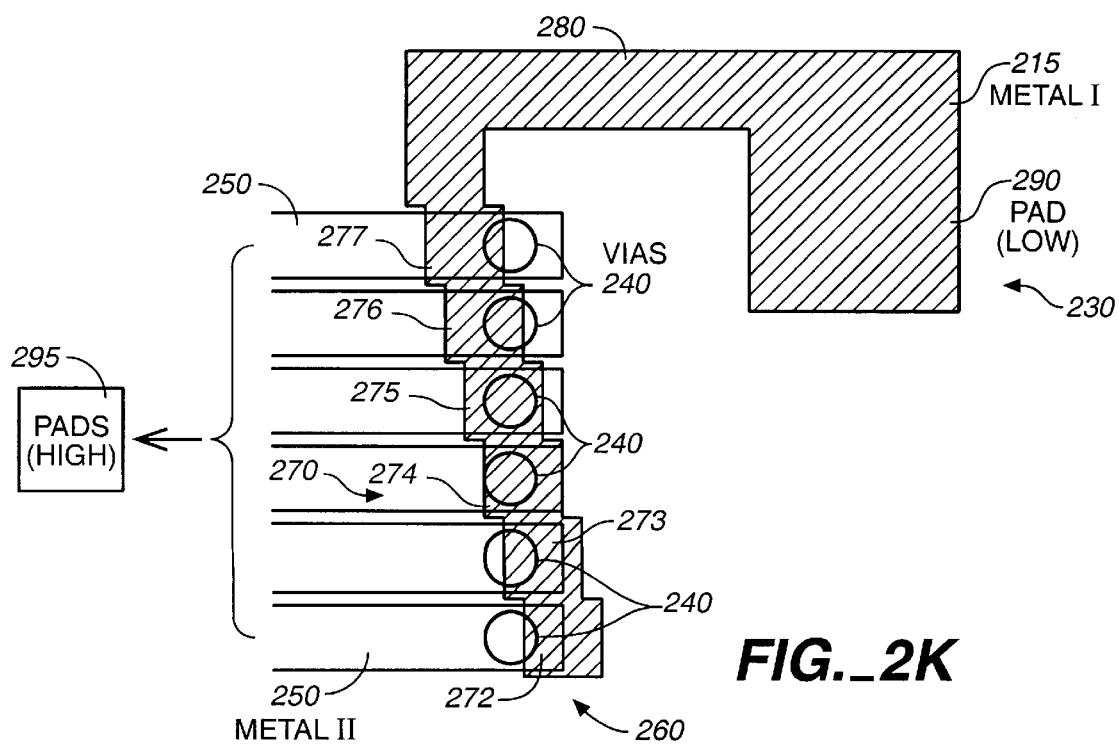
FIG._2K

METHOD AND SYSTEM FOR ALIGNMENT OF OPENINGS IN SEMICONDUCTOR FABRICATION

BACKGROUND OF THE INVENTION

This invention relates to methods for processing semiconductor materials, and in particular to methods for measuring the amount of alignment offset problems in the fabrication of a semiconductor which exist between an interconnect layer and a layer having opening therein such as vias or the like, and provides for effective and efficient electrical and visual alignment confirmation of the location of the openings.

Today's semiconductor technology has been advancing in a direction that requires ever increasing numbers of interconnections with integrated circuits. Typically a large number of integrated circuits are formed on a silicon wafer. Then, they are sliced into individual integrated circuit dies (or chips). Each die is then packaged and used. Electrical connections to the dies are made in one of a few ways. In one type of package, a die receiving area (or die receiving cavity) is provided in the package to receive an integrated circuit die. A number of conductive lines (traces or leads) whose outer ends are electrically connected to pins or leads on the package extend inward towards the die receiving area, usually in a radial pattern, stopping just short of the periphery of the die. The die has a number of "bond pads" for the purpose of making electrical connections with the inner ends of the conductive lines, and is mounted such that the bond pads are exposed. The inner ends of these conductive traces or leads are positioned such that they form an array of connection points surrounding the die. Very thin "bond wires", usually formed of a metal such as aluminum or gold, are then used to connect the connections points on a one for one basis with the bond pads on the integrated circuit die. After mounting, the area or cavity containing the die and the bond wires is usually sealed with a cover or an encapsulant to protect the die and the bond wires from ambient moisture or physical damage.

Semiconductor integrated circuits undergo a variety of processing steps during manufacture, such as masking, resist coat, etching, and deposition. In many of these steps, material is overlayed or removed from the existing layer at specific locations in order to form the desired elements of the integrated circuit. Proper alignment of the various process layers is therefore critical. The shrinking dimensions of modern integrated circuits require increasingly stringent overlay alignment accuracy. If the proper alignment tolerance is not achieved, a device can result which is defective or has reliability problems. More specifically, semiconductor processes such as described above employ fabrication steps in which aligned openings are formed in contact layers and multiple interconnect layers to complete an electrical connection. The interconnect layer is typically a metal layer and the contact layer or via layer is typically an insulating/dielectric layer Registration is typically used to measure the accuracy of a process layer alignment performed using an alignment mark. Registration involves comparing the position of a subsequent layer to that of an existing layer by overlaying a distinct pattern on a matching pattern previously formed on the existing layer. The deviation in position of the overlay from the original provides a measure of accuracy of the alignment. Currently available registration structures include box-in-box visual verniers to determine the extent of registration, i.e., the amount of alignment offset. Automatic Measurement Systems ("AMS") and Canomap, each of which uses a different type of structure or pattern for comparison.

Under current practice using alignment marks, optimization of alignment of respective openings involves testing mark sizes and shapes. Subsequent registration of respective test wafers are used to verify the alignment using the alignment mark. One existing method to optimize an alignment mark uses a waferstepper test reticle with a single type of alignment mark to generate a first process layer, followed by printing the second layer resist pattern, and then performing registration on an overlay in both X and Y directions. The mark which results in the "best registration" reading is chosen as the optimal mark.

However, this and other similar techniques have a number of disadvantages. For example, the measurement results do not provide information regarding the position of the alignment marks within acceptable process performance specifications. Another problem is that a full array of alignment marks and registration overlays are not available to test. Furthermore, layer process variations which may effect the overlay are not taken into account in the measurements. Thus, none of the currently available registrability measurement techniques determine whether a particular alignment mark is indeed optimal. In order to get overlay registration measurements from different alignment mark sizes, the test wafers must be stripped, re-spun and re-exposed several times. This could potentially alter the film surface and thereby affect alignment measurement results. In order to optimize other types of alignment marks, a different set of test wafers would have to be generated using a different test reticle. Furthermore, the test reticles do not include the capability for orthogonal measurements, which means that measurement results are considerably more difficult to model mathematically. These drawbacks limit the achievable alignment accuracy, and result in significantly increased manufacturing costs and greater likelihood of device defects.

As previously described above, visual alignment targets with box in box method are generally used to visually determine the alignment accuracy of contact layer openings to the underlying layers (See FIG. 1A).

A separate electrical structure with contact chains layout in both X and Y direction to detect the alignment accuracy (see FIGS. 1B & 1C).

Thus, the discontinuous structural patterns, such as the box in box design described above, are used for separately performing the functions of (a) visual inline alignment confirmation and (b) electrical measurement with scribeline structure at end of line to determine the accuracy of the alignment during manufacturing. This has made it very difficult to correlate the alignment accuracy of the openings to the underlining layer due to the sensitivity and difference in the structures.

There is thus a need that exists for a system and method for reducing alignment offset problems between an interconnect layer and/or contact layer and the layer containing the openings.

SUMMARY OF THE INVENTION

The above-described needs have been met by the system and method of the present invention which enables the effective and efficient determination of the above-described misalignment between the via and interconnect contact layers. In this way, defective semiconductors produced in semiconductor wafer fabrication can be readily identified and segregated for shipment to customers.

A single multifunctional structure formed in the interconnect layer can be used to determine the alignment accuracy of contact and via inline visual inspection and end of line electrical examination of the resistance properties of the semiconductor wafer. Hence the use of the multifunctional aspects of this invention eliminates the correlation issues with the structure.

This also allows for a quick electrical check at end of line failure analysis to eliminate contact and via alignment problem during FA confirmation. This should provide a single structure to determine both inline and end of line alignment accuracy between via to the underlying metal or diffusion layers, and will allow cross check between inline visual and end of line electrical confirmation of alignment accuracy. The subject structure will eliminate the necessity of taking a cross section during failure analysis to confirm via alignment. This will speed up the failure analysis with related problem The prior art, on the other hand, continues to use two separate structures; one at inline for visual examination, and the other at the end of the line to determine alignment structure. The prior art also continues to struggle with the correlation issues with two separate structures. Moreover, no individual alignment structure can be dropped into each die for alignment confirmation during failure analysis.

More specifically, the present invention is directed to a method for determining both inline and end of line alignment accuracy between openings in a contact layer and at least one underlying interconnect layer of a semiconductor device by inline visual and end of line electrical confirmation of alignment accuracy of a semiconductor device. The subject method comprises forming a unitary multifunctional alignment structure in an interconnect layer for use in both inline visually aligning and electrically measuring the alignment accuracy of each and semiconductor wafers. First, the relative position of the openings inline is visually compared with respect to the multifunctional alignment structure to determine the degree of offset of the openings with the design rule of the semiconductor wafer. Then, the amount of misalignment of the openings is electrically measured and compared with respect to the multifunctional alignment structure to determine the degree of offset of the openings with the design rule of the semiconductor wafer. The interconnect layers are typically metallic layers. Preferably, the unitary multifunctional alignment structure is an integral continuous structural member having a stairstep design for use in maximizing the overlay capabilities with respect to the openings by the unitary multifunctional alignment structure. Furthermore, the integral continuous structural member can include an alignment indicator section comprising a series of individual rectangular stairstep sections which are joined together and offset with respect to each other. The size and relative offset location of the individual rectangular stairstep sections is preferably an inline visual alignment standard for checking the size and relative position of the openings against the design rule of the semiconductor wafer. In one form of this invention, the step of electrically measuring the amount of misalignment of the openings with respect to the multifunctional alignment structure is conducted at the conclusion of the semiconductor wafer formation process. The present invention can further include the steps of connecting the first interconnect layer to a first bond pad, connecting the second interconnect layer to a second bond pad having a lower resistance than the first bond pad, and thereby forming an electrical connection between and first and second interconnect layers and each of the openings, respectively. Next, an electrical voltage is applied between first and second interconnect layers and each of the openings, respectively. The current between the first and second interconnect layers and each of the openings is measured. In this way, the resistance between the first and second interconnect layers and each of the openings can be calculated, and the alignment accuracy of each of the semiconductor wafers being tested can be electrically measuring based on difference in the resistance between the first and second interconnect layers and each of the openings.

As described above, a unitary multifunctional alignment structure is formed in a semiconductor device for determining both inline and end of line alignment accuracy between openings in a contact layer and at least one underlying interconnect layer of and semiconductor device. This can be accomplished by inline visual and end of line electrical confirmation of alignment accuracy of and semiconductor device. Such a multifunctional alignment structure comprises means for visually comparing the relative position of the openings inline with respect to the multifunctional alignment structure to determine the degree of offset of the openings with the design rule of the semiconductor wafer, and means for electrically measuring the amount of misalignment of the openings with respect to the multifunctional alignment structure to determine the degree of offset of the openings with the design rule of the semiconductor wafer.

The unitary multifunctional alignment structure of the unitary multifunctional alignment structure is an integral continuous structural member having a stairstep design for use in maximizing the overlay capabilities with respect to the openings by the unitary multifunctional alignment structure. The unitary multifunctional alignment structure preferably comprises an integral continuous structural member including an alignment indicator section comprising a series of individual rectangular stairstep sections which are joined together and offset with respect to each other, the size and relative offset location of individual rectangular stairstep sections is an inline visual alignment standard for checking the size and relative position of the openings against the design rule of the semiconductor wafer.

A preferred method of this invention can produce semiconductor wafers which including a contact layer located between a pair of interconnect layers, the contact layer having a plurality of the openings formed therein which are in substantial alignment without offset with said interconnect layers. This preferred method typically comprises the steps of providing a silicon wafer substrate having an outer surface on which is formed a first contact layer. A first interconnect layer is then formed on an outer surface of said contact layer. Next, the subject unitary multifunctional alignment structure is formed in the interconnect layer for use in both inline visually aligning and electrically measuring the alignment accuracy of each of the semiconductor wafer. A second contact layer is formed on an outer surface of said first interconnect layer, and then a plurality of openings is formed in a predetermined pattern in said second contact layer.

At this point of the process, one can visually compare the relative position of the openings inline with respect to the multifunctional alignment structure to determine the degree of offset of the openings with the design rule of the semiconductor wafer. If the degree of offset is within the design rule, a second interconnect layer is formed on an outer surface of said second contact layer. In the final step, the amount of misalignment of the openings is electrically measured with respect to the multifunctional alignment structure to determine the degree of offset of the openings with the design rule of the semiconductor wafer.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1A is a schematic representation of prior art visual alignment targets with box in box design which are used to visually determine the alignment accuracy of contact layer openings to the underlying layers.

FIG. 1B is a prior art schematic representation of a separate electrical structure with contact chains which form a layout in the X direction to detect alignment accuracy.

FIG. 1C is a prior art schematic representation of a separate electrical structure with contact chains which form a layout in the Y direction to detect alignment accuracy.

FIGS. 2A–2I are cross-sections of a semiconductor substrate in various stages of processing in accordance with a preferred form of the present invention.

FIG. 2J is a schematic representation of a preferred photoresist pattern having a multifunctional unitary design structure capable for use in the inline visual determination of the degree of offset of the openings with the design rule of the semiconductor wafer.

FIG. 2K is a schematic representation of a preferred photoresist pattern having a multifunctional unitary design structure capable for use in the electrical measurable determination of the degree of offset of the openings with the design rule of the semiconductor wafer.

DETAILED DESCRIPTION OF A PREFERRED EMBODIMENT

Referring to FIG. 2A there is shown a semiconductor wafer 200, including an underlying transistor structure which is completely formed therewithin, comprises a substrate 202, typically a semiconductor wafer substrates and an insulating/dielectric layer 210 which can act as a contact or via layer in accordance with the present invention. Insulating/dielectric layer 210 forms a protective barrier for substrate 202 and allows various materials to be exposed by selective etching, as described herewith in greater detail below. Contacts (not shown) are etched into the layer 210 to provide external electrical connections.

The thickness of insulating/dielectric layer 210 is selected to allow semiconductor wafer 200 to proceed through various modifications of insulating/dielectric layer 210.

Insulating/dielectric layer 210 may be formed by a variety of known processes. The most common methods, however, decomposing tetraethylorthosilicate or tetraethoxysilane, with or without oxygen, or chemical vapor deposition (CVD) or plasma-enhanced chemical vapor deposition (PECVD) for hole patterns once a metal interconnect layer pattern is on the wafer.

A first interconnect layer 215 is formed by depositing a metal layer onto the exposed surface formed by insulating layer 210, and then performing standard chemical-mechanical polishing (CMP) to achieve a planar surface over the entire semiconductor wafer 200 as in FIG. 2B. Interconnect layer 215 can be formed of the following metallic materials: barrier metals such as TiN or TiW, and metal alloys such as AL Si—Cu, Al—Cu, or Al or Cu per se. The layer 215 can be formed employing any of the following deposition techniques: Evaporation, Reactive Sputtering, Single Target Sputtering, PVD or CVD. The thickness of interconnect layer 215 is selected to allow semiconductor wafer 200 to exhibit maximum electrical interface properties required by the ultimate product end use.

Referring now to FIG. 2C, once interconnect layer 215 has been deposited onto the substrate 202, a photoresist masking step is conducted. A photoresist material is employed having a develop rate which is dependent upon the amount of UV light transmitted and is capable of having formed therein a pattern of selected multiple opening configurations. Conventional optical lithography techniques are generally employed. An optical lithography tool typically consists of an ultraviolet (UV) light source, a photomask, an optical system, and wafer covered with a photoresist layer. The mask is flooded with UV light from the light source and the mask pattern is imaged onto the resist by the optical system. The most commonly used UV light sources for optical lithography are high-pressure arc lamps and laser sources. An exemplary multi-functional photoresist formation process to form photoresist layer 220 is described as follows:

a. Pretreat the wafer with an adhesion promoter such as hexamethyldisilazane.

b. Spin a photoresist material to form photoresist layer 220.

c. Remove any edge bead of photoresist material.

d. Softbake the photoresist material to remove resist solvent and increase resist wafer adhesion.

Photoresist 220 is spun on as an organic film. The thickness of photoresist 220 is selected to mask the underlying areas of insulating layer 210 against etching.

Semiconductor wafer 200 is depicted in FIG. 2C following the spinning on of the photoresist mask 220. A preferred photoresist pattern, which will impart to the metal interconnect layer 215 a multifunctional unitary design structure 230 (See FIGS. 2J and 2K) capable for use in facilitating the system and method of the present invention, is then exposed onto photoresist mask 220. More particularly, the unitary multifunctional structure 230 of this invention will provide a user with the capacity to determine the alignment accuracy of vias 240 aligned between two layers of metal interconnects 215 and 250 in a semiconductor manufacturing application. Thus, the use of the preferred photoresist pattern for producing structure 230 enables a user to perform both of the following functions using a single unitary structure: (a) visually determination inline of the via accuracy and (b) electrically determine alignment accuracy of the electrical structure at the end of line.

Referring again to FIGS. 2J & 2K, structure 230 for use in performing the dual inline visual function (FIG. 2J) and the electrical measurement alignment function (FIG. 2K) is designed with multiple vias 240 overlapping the underlying metal layers 215 & 250. The integral continuous structural member 230, preferably having a stairstep design generally designed "260", is employed for use in maximizing the overlay capabilities with respect to the vias 240 by the structural configuration 230. Structure 230 comprises an alignment indicator section generally "270" comprising a series of individual rectangular stairstep sections 272–277 which are joined together and offset with respect to each other. Alignment indicator section 276 is attached to a bond pad 290 by a connector member 28. The size and relative offset location of individual rectangular stairstep sections 272–277 comprises an inline visual alignment standard for checking the size and relative position of the vias 240 against the design rule of the semiconductor wafer 200. Stated another way, the position of the vias should be substantially self-contained within the design rule of the underlying semiconductor wafer, and the structure 230 can be used to indicate the alignment accuracy. Alignment is very important to the functionality of the semiconductor circuits as a whole.

The structure 230 can be electrically measured at the end of wafer fabrication process to determine the amount of misalignment. In this way, a single structure can be employed to measure alignment offset both by, in addition to conducting inline visual inspection, also determining the end of the line electrical properties. For example, multiple mini contact pads 290 and 295 in the subject design are used to electrically measure and establish the correlation between the resistance and the amount of misalignment. As shown in FIG. 2J, contact pad 290, which is attached to connector member 280, is at a lower resistance than contact pad 295. High resistance contact pads 295 are attached to the second metal layer 250. The resistance between these contact pads is readily measurable to determine alignment compliance of a give semiconductor wafer 200.

The most commonly used imaging technique for printing a predetermined pattern onto photoresist layer 220 (shown as "225" in FIG. 2D) is projection printing using a conventional image projection system in which lens assemblies are used to focus the mask pattern onto the semiconductor wafer 200 which is separated from the mask typically by a distance of several centimeters. The most widespread printing technology used today is the step-and-repeat projection system. Scanners are also employed for photomask printing purposes. The subject photoresist process can be conducted in any of these image projection systems.

As depicted in FIGS. 2E and 2F, a pattern 225 is generated using a previously aligned and loaded pattern reticle in an image projection system such as a conventional Stepper or Scanner which is exposed with a standard dose of a standard transmission chrome. The preferred conditions for generating a predetermined dose of light from the subject DUV light source that is needed in the formation of pattern 225, is as follows:

a. Form a focus/expose matrix sample wafer coated with the requisite photoresist material.
 b. Take the wafer from prior step a. through a standard resist develop cycle.
 c. Measure the opening dimension formed using a CD SEM metrology tool.
 d. Determine the optimum dose and focus for a given opening size.

Next, the wafer proceeds through standard Post Exposure Bake (PEB) which is employed primarily to reduce standing wave effects by reducing the ridges at the resist edges and to reduce airborne contamination incorporation into the resist. Then, the resist is developed using conventional developer technology. Development is a critical step in resist processing playing a key role in defining the shape of the resist profile and controlling the line-width of the interconnect layer. Finally, a post-development hardbake is performed by standard methods to give the remaining resist images the adhesion necessary to withstand subsequent processing steps such as in this case, etching.

The semiconductor wafer depicted in FIG. 2D is then subjected to an etching step which will impart the aforementioned multifunctional structural pattern into the interconnect layer 215. The etching step can comprise standard a anisotropic etch, for example, $CF_4$, $C_2F_6$, or $CHF_2$ gas chemistry using RIE (Reactive Ion Etch), MERIE (magnetically enhanced RIE), or ICP (Inductive Coupled RF Plasma) etching techniques.

Photoresist mask 220 is then stripped away from the semiconductor wafer 200. Referring now to FIG. 2E, there is shown a cross-section of semiconductor wafer 200 following removal of photoresist mask 220. Photoresist mask 220 may be removed by means of chemical solvents appropriate for the photoresist material or by etching the photoresist material in an oxygen plasma using a known "ashing" process.

FIG. 2F reveals semiconductor wafer 200 having a second insulating layer 300 deposited onto the first metal layer 215. The deposition of second insulating layer is similar to the above-described procedure for the deposition of first insulating layer 210.

Next, as described above and depicted in FIG. 2G, a photoresist layer 310 is deposited onto second insulating layer 300, a predetermined via pattern 320 is developed in the photoresist layer 310, and etching step is conducted, and the photoresist is removed from the layer 300. In this case, the via pattern comprises a straight line of vias 240 formed on top of the stairstep metal structure. A via etch step similar to the prior etching process described above is performed to produce the straight line of vias 240.

After removal of the photoresist material 310, as shown in FIG. 2H, visual inspection of the alignment of the vias 240 and the structural pattern 230 is conducted to ensure alignment between the layer 215 and the vias 240. Thus, one can readily inspect the inline visual structure to determine the above-described alignment.

Finally, a second interconnect layer deposition step is conducted, for depositing an outer interconnect layer 330, as shown in FIG. 2I, which is conducted in a similar manner to the deposition step depicted in FIG. 2B, as has been previously described herein.

An electrical connection between the interconnect layers 215 and 250, and the vias 240, is completed. Then, an electrical voltage is applied via contact pads 290 and 295 between layers 215 and 250, and a current is measured for a given resistance calculation. This measurement is repeated for each of the vias 240 with respect to the layers 215 and 250 of the stairstep structure. The difference in resistance can then be calculated to determine the accuracy of the via to metal alignment properties of each via 240.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method for producing semiconductor wafers including a contact layer located between a pair of interconnect layers, the contact layer having a plurality of openings formed therein which are in substantial alignment without offset with and interconnect layers, comprising the steps of:

providing a silicon wafer substrate;
 forming a first contact layer on an outer surface of and silicon wafer substrate;
 forming a first interconnect layer on an outer surface of and contact layer;
 forming a unitary multifunctional alignment structure in and interconnect layer for use in both inline visually aligning and electrically measuring the alignment accuracy of each of the semiconductor wafers;
 forming a second contact layer on an outer surface of and first interconnect layer;
 forming a plurality of openings in a predetermined pattern in and second contact layer;
 visually comparing the relative position of the openings inline with respect to the multifunctional alignment structure to determine the degree of offset of the openings with the design rule of the semiconductor wafer;

forming a second interconnect layer on an outer surface of and second contact layer; and electrically measuring the amount of misalignment of the openings with respect to the multifunctional alignment structure to determine the degree of offset of the openings with the design rule of the semiconductor wafer.

2. The method of claim 1, wherein the first and/or the second interconnect layers is a metallic layer.

3. The method of claim 1, wherein the unitary multifunctional alignment structure is an integral continuous structural member having a stairstep design for use in maximizing the overlay capabilities with respect to the openings by the unitary multifunctional alignment structure.

4. The method of claim 3, wherein the integral continuous structural member includes an alignment indicator section comprising a series of individual rectangular stairstep sections which are joined together and offset with respect to each other, the size and relative offset location of individual rectangular stairstep sections is an inline visual alignment standard for checking the size and relative position of the openings against the design rule of the semiconductor wafer.

5. The method of claim 1, wherein the step of electrically measuring the amount of misalignment of the openings with respect to the multifunctional alignment structure is conducted at the conclusion of the semiconductor wafer formation process.

6. The method of claim 1, which includes the steps of connecting the first interconnect layer to a first bond pad, connecting the second interconnect layer to a second bond pad having a lower resistance than said first bond pad and thereby forming an electrical connection between said first and second interconnect layers and each of said openings, respectively; applying an electrical voltage between first and second interconnect layers and each of said openings, respectively; measuring the current between the first and second interconnect layers and each of said openings; calculating the resistance between the first and second interconnect layers and each of said openings; and determining the alignment accuracy of each of the semiconductor wafers being tested based on difference in the resistance between the first and second interconnect layers and each of said openings.

7. A method for determining both inline and end of line alignment accuracy between openings in a contact layer and at least one underlying interconnect layer of a semiconductor device by inline visual and end of line electrical confirmation of alignment accuracy of said semiconductor device, which comprises:

forming a unitary multifunctional alignment structure in said interconnect layer for use in both inline visually aligning and electrically measuring the alignment accuracy of each of said semiconductor wafers;

visually comparing the relative position of the openings inline with respect to the multifunctional alignment structure to determine the degree of offset of the openings with the design rule of the semiconductor wafer; and electrically measuring the amount of misalignment of the openings with respect to the multifunctional alignment structure to determine the degree of offset of the openings with the design rule of the semiconductor wafer.

8. The method of claim 7, wherein the first and/or the second interconnect layers is a metallic layer.

9. The method of claim 7, wherein the unitary multifunctional alignment structure is an integral continuous structural member having a stairstep design for use in maximizing the overlay capabilities with respect to the openings by the unitary multifunctional alignment structure.

10. The method of claim 9, wherein the integral continuous structural member includes an alignment indicator section comprising a series of individual rectangular stairstep sections which are joined together and offset with respect to each other, the size and relative offset location of individual rectangular stairstep sections is an inline visual alignment standard for checking the size and relative position of the openings against the design rule of the semiconductor wafer.

11. The method of claim 7, wherein the step of electrically measuring the amount of misalignment of the openings with respect to the multifunctional alignment structure is conducted at the conclusion of the semiconductor wafer formation process.

12. The method of claim 7, which includes the steps of connecting the first interconnect layer to a first bond pad, connecting the second interconnect layer to a second bond pad having a lower resistance than said first bond pad and thereby forming an electrical connection between said first and second interconnect layers and each of said openings, respectively; applying an electrical voltage between first and second interconnect layers and each of said openings, respectively; measuring the current between the first and second interconnect layers and each of said openings; calculating the resistance between the first and second interconnect layers and each of said openings; and determining the alignment accuracy of each of the semiconductor wafers being tested based on difference in the resistance between the first and second interconnect layers and each of said openings.

* * * * *